(12) United States Patent
Thorup et al.

(10) Patent No.: US 11,683,239 B2
(45) Date of Patent: Jun. 20, 2023

(54) SYNCHRONIZING DYNAMIC LINK BUDGETS WITH FPGA BASED SIMULATION WAVEFORM STATE MACHINES

(71) Applicant: L3Harris Technologies, Inc., Melbourne, FL (US)

(72) Inventors: Seth J. Thorup, Sandy, UT (US); Kyle R. Morrey, Farmingotn, UT (US); Stephen N. Jenkins, Layton, UT (US); Brent A. Kenney, Bountiful, UT (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 37 days.

(21) Appl. No.: 17/318,937

(22) Filed: May 12, 2021

(65) Prior Publication Data
US 2022/0368599 A1 Nov. 17, 2022

(51) Int. Cl.
*H04L 41/14* (2022.01)
*H04L 47/32* (2022.01)

(52) U.S. Cl.
CPC ............ *H04L 41/145* (2013.01); *H04L 47/32* (2013.01)

(58) Field of Classification Search
CPC ........... H04L 2001/0093; H04L 1/0057; H04L 1/0041; H04L 1/009; H04L 1/004; H04L 1/0071; H04L 1/0072; H04L 1/0083; H04L 2001/0098; H04L 47/10; H04L 47/2416; H04L 47/283; H04L 47/38; H04L 41/145; H04L 45/00; H04L 45/70; H04L 47/11; H04L 43/50; H04L 65/80; H04L 43/0829; H04L 43/087; H04L 1/0009; H04L 1/0014; H04L 65/1101; H04L 67/01; H04L 43/00;
(Continued)

(56) References Cited

U.S. PATENT DOCUMENTS

| | | | |
|---|---|---|---|
| 6,442,141 B1 * | 8/2002 | Borella | H04L 43/50 370/248 |
| 2002/0031126 A1 * | 3/2002 | Crichton | H04L 12/6418 370/506 |

(Continued)

OTHER PUBLICATIONS

Anonymous: "Link budget—Wikipedia", Feb. 19, 2021, pp. 1-5.
(Continued)

*Primary Examiner* — Djenane M Bayard
(74) *Attorney, Agent, or Firm* — Workman Nydegger

(57) ABSTRACT

A system for simulating lost data packets. The system includes a first hardware register storing data for fast factors. The fast factors include factors that are time independent with respect to particular data packets. A second hardware register stores slow factors. The slow factors include factors that are time dependent on data packets. Synchronization hardware is coupled to the second hardware register and synchronizes the slow factors with specific data inputs based on dependencies on the data packets. A hardware adder is coupled to the first hardware register and the second hardware register to compute a link budget. The link budget is used in determine probability of loss of data packets. A hardware processor coupled to the hardware adder determines, based on the link budget, if a data packet should be dropped, and when the data packet should be dropped, drops the data packet for simulating a network physical layer.

20 Claims, 8 Drawing Sheets

(58) Field of Classification Search
CPC ..... H04L 43/0852; H04L 47/32; H04L 43/08;
H04L 65/70; H04L 41/142; H04L 65/65;
H04L 43/12; H04L 49/90; H04L 69/02;
H04L 69/16; H04L 12/6418; H04L 12/66;
H04L 25/20; H04L 41/0803; H04L 41/14;
H04L 41/5009; H04L 43/0835
See application file for complete search history.

(56) References Cited

U.S. PATENT DOCUMENTS

2012/0287986 A1\* 11/2012 Paniconi ............. H04N 19/196
　　　　　　　　　　　　　　　　　　　　　　　　375/E7.126
2016/0218983 A1\* 7/2016 Dao ........................ H04L 47/30

OTHER PUBLICATIONS

Borries et al., "Experience with a wireless network testbed based on signal propagation emulation", Proceedings of the IEEE European Wireless Conference, Apr. 12, 2010, pp. 833-840.
European Search Report received for EP Patent Application No. 22169936.6, dated Oct. 10, 2022, 10 pages.

\* cited by examiner

SYNCHRONIZING DYNAMIC LINK BUDGETS WITH FPGA BASED SIMULATION WAVEFORM STATE MACHINES

BACKGROUND

Background and Relevant Art

Developing computing and communication hardware is an expensive proposition. Such development typically includes brainstorming to create a conceptual design, defining system architecture and hardware requirements, creating a primary design that complies with the requirements, creating further designs-based on lessons learned with the primary design to create system hardware, integrating the system hardware into overall systems, and testing the overall system with the hardware included.

Such development can be particularly expensive if multiple iterations of creating and testing hardware are performed to arrive at the final design. Each of these iterations will require expensive hardware and time-consuming fabrication processes to produce hardware that will likely not be the most suitable for use in an overall system. This can result in high expense, increased time required for development, and/or an acceptance of a substandard design.

To combat this, various modeling tools have been invented to allow for modeling hardware designs so that a number of iterations of a design can be implemented by a model before any actual system hardware has to be fabricated. However, the majority of these modeling tools are software-based. Unfortunately, software modelling tends to be constrained in several respects. For example, software modeling tools are not able to handle the data rates required for real time simulation of high-speed data stream handling and communications channel simulation. Further, software-based systems are often non-deterministic in nature due to processor time division multiplexing, memory reads and writes, and other software centric problems. This nondeterminism makes it difficult to test specific conditions. Further still, these software based systems typically make use of an event scheduler for ensuring correlation of timing of certain simulation activities. However, these event schedulers typically represent a bottle neck for simulation performance and capacity.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a system for simulating lost data packets in a network simulation. The system includes a first hardware register configured to store data for fast factors. The fast factors include factors that are time independent with respect to particular data packets. A second hardware register is configured to store slow factors. The slow factors include factors that are time dependent on data packets. Synchronization hardware is coupled to the second hardware register and is configured to synchronize the slow factors with specific data inputs based on dependencies on the data packets. A hardware adder is coupled to the first hardware register and the second hardware register to compute a link budget. The link budget is used in determining probability of loss of data packets. A hardware processor is coupled to the hardware adder. The hardware processor is configured to determine, based on the link budget, if a data packet should be dropped, and when the data packet should be dropped, to drop the data packet for simulating a network physical layer.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments illustrated herein are directed to using custom hardware for modeling the data plane. That is, the physical layer used for communication channels (or at least portions thereof) of the Open System Interconnect (OSI) model can be modelled using custom and configurable hardware which is able to handle the high data rates from high-speed communication systems, such as satellite communications, or other high-speed communications, and to provide deterministic outputs in contrast to previous systems with only software modeling which result in non-deterministic modeling. This custom hardware is configurable so as to be able to use the hardware for modeling various different and changing characteristics for the physical layer. In particular, embodiments can use hardware such as Field Programmable Gate Array (FPGA) hardware, Very High Speed Integrated Circuit (VHSIC) hardware, Complex Programmable Logic Device (CPLD), Application Specific Integrated Circuit (ASIC) and/or other hardware to model antenna patterns, modems, framers, routers, modulated waveforms over the air, RF equipment, RF losses, RF propagation channels, etc. In some embodiments, this can be accomplished by simply modeling latency, jitter, and losses directly at the hardware. Thus, in its broadest sense, some embodiments of the invention are directed to using customized hardware to model the physical layer of the OSI model.

Figure 1:
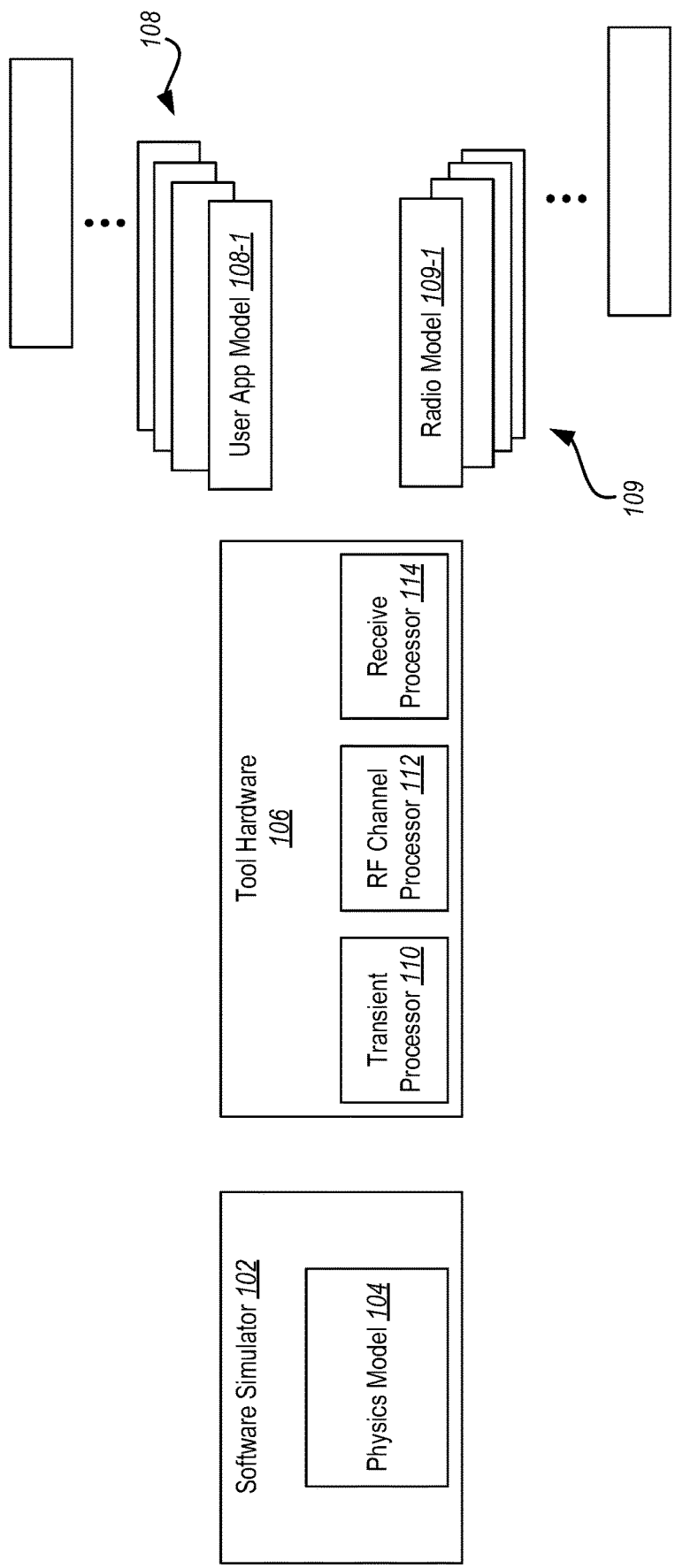
FIG. 1 illustrates an overview of a hardware system.

Referring now to FIG. 1, a simplified block diagram is illustrated showing various principles of the invention. In the example illustrated in FIG. 1, a software simulator 102 includes a physics model 104 which includes model parameters for various characteristics of communication hardware including model antenna patterns, modems, framers, routers, modulated waveforms over the air, RF equipment, RF losses, RF propagation channels etc. Further, the physics model 104 includes details with respect to a temporal modeling scenario including details with respect to changes in terrain, weather, noise pollution, presence of jammers, presence of other waveforms, and other factors that may affect a waveform in an environment. That is, the physics model 104 may include information for simulation that will affect how a waveform is received including factors contributing to latency, jitter, and losses occurring for various reasons, including static hardware design related reasons and dynamic temporal simulation scenario related reasons. In particular, the software simulator 102 using the physics model 104 will compute, over time, various changes that should occur with respect to the physical layer as a result of changes in an environment, changes in position of vehicles having communication equipment, changes in position of targets for data, etc.

As illustrated in FIG. 1, the information computed at the software simulator 102 can be used to control the tool hardware 106. In some embodiments, the tool hardware 106 comprises an FPGA specifically designed and implemented for modeling the physical layer. In particular, in some embodiments, certain coefficient values can be applied to particular registers of the tool hardware 106 to create a deterministic system that behaves in a consistent fashion dependent only on the coefficient values in the registers, thus eliminating nondeterministic behaviors observed when doing software only simulation. Additionally, using customized hardware such as the tool hardware 106 removes processor latency issues that are often present when using only software-based simulation.

Returning once again to FIG. 1, the tool hardware 106 includes a user input for receiving network data from user models representing simulated nodes, such as user app models 108 or radio models 109. Note that the tool hardware 106 may receive data from actual nodes in other embodiments. For example, the user app and radio models 108 and 109 may be a simulated or actual user interface in an actual aircraft, satcom control, ground communication equipment, radio equipment, etc. That is, in some embodiments, the user app and radio models are implemented using software in the loop (SWIL) models only intended to mimic functionality of actual user applications and/or radios, whereas in other embodiments, actual application or radios can be connected to the tool hardware. That is, the tool hardware includes interfaces for real life apps and models, but may be connected to models or real life examples depending on the development stage. In this way high-speed data from the user app model 108-1 (from among a plurality of user app models 108) or radio model 109-1 (from among a plurality of user app models 109) can be fed into the tool hardware 106. The physical layer model implemented by the tool hardware 106 is applied to such data so as to simulate transmission of the data on a physical layer data plane, including simulation of model antenna patterns, modems, framers, routers, modulated waveforms over the air, RF equipment, RF losses, RF propagation channels, etc., on that data plane. As noted previously, in some embodiments this can be achieved in a simplistic fashion by simply matching latency, jitter, and losses identified in the physics model 104, and used to control the tool hardware 106.

Note that a single piece of custom hardware, such as the tool hardware 106, can be built to support multiple waveform processors, allowing for simulation of many transmitters and receivers with tightly synchronized timing.

The tool hardware 106 is a custom waveform processor and is comprised of three main sub-processors—the transmit processor 110, RF channel processor 112, and receive processor 114. The transmit processor 110 arranges the data blocks as defined by the waveform, emulates data link rates, and emulates transmit power characteristics. The RF channel processor 112 provides interconnectivity and channel delay between simulated nodes (e.g., between user app models and/or radio models). The receive processor 114 models channel loss and state-based link acquisitions and drops. This custom waveform processor (i.e., the tool hardware 106) models the waveform by breaking down the components of the waveform into bit level data blocks, allowing for high fidelity modeling of waveform characteristics. Using this hardware accelerated approach to simulation enables higher data rates, fidelity, and node counts (i.e., number of nodes that can be simulated using the same hardware) than would otherwise be possible.

Embodiments are therefore able to simulate a fully connected system of many high throughput nodes running high fidelity communications waveforms in real-time. This relieves a general-purpose processor (GPP) running the simulation on a non-real-time operating system from the heavy burden of high precision timing and data processing.

In some embodiments, all, or at least most, data plane processing in a simulation is performed in the custom tool hardware 106. Multiple instances of transmitter/receiver pairs are connected through an RF channel model that can manage tens of thousands of potential connections concurrently. Each transmit and receive model is able to process data at the same rate as an actual modem, so a single piece of custom hardware can accurately model many pieces of actual hardware. High fidelity is achieved, in some embodiments, by synchronizing all of the parallel processing engines to a single clock. This method of hardware assisted waveform modeling moves the most computationally intensive and timing critical pieces of the simulator from software to hardware.

Traditional software-based simulators suffer from not being able to perform many operations concurrently. The tool hardware 106 can be built to be highly parallel, allowing it to operate on multiple calculations at the same time. With this hardware assisted simulation technique, there is no need to design around operating system schedulers. The use of custom hardware in modeling a communications waveform enables high aggregate data rates and high scalability at a level of fidelity that far surpasses any existing simulation techniques. Further, it enables simulation that is not possible in software-based simulation.

In some embodiments, the tool hardware 106 can be made even more efficient by storing user data in memory or other storage and using pointers and metadata to simulate data transmissions. This can further preserve and/or increase the capacity of the tool hardware. That is, rather than needing to move massive amounts of data multiple times in the simulated data plane, and thus requiring extensive resources, embodiments can virtually move data by storing the data and using metadata to simulate its movements, while using pointers when the actual data is needed.

Figure 2:
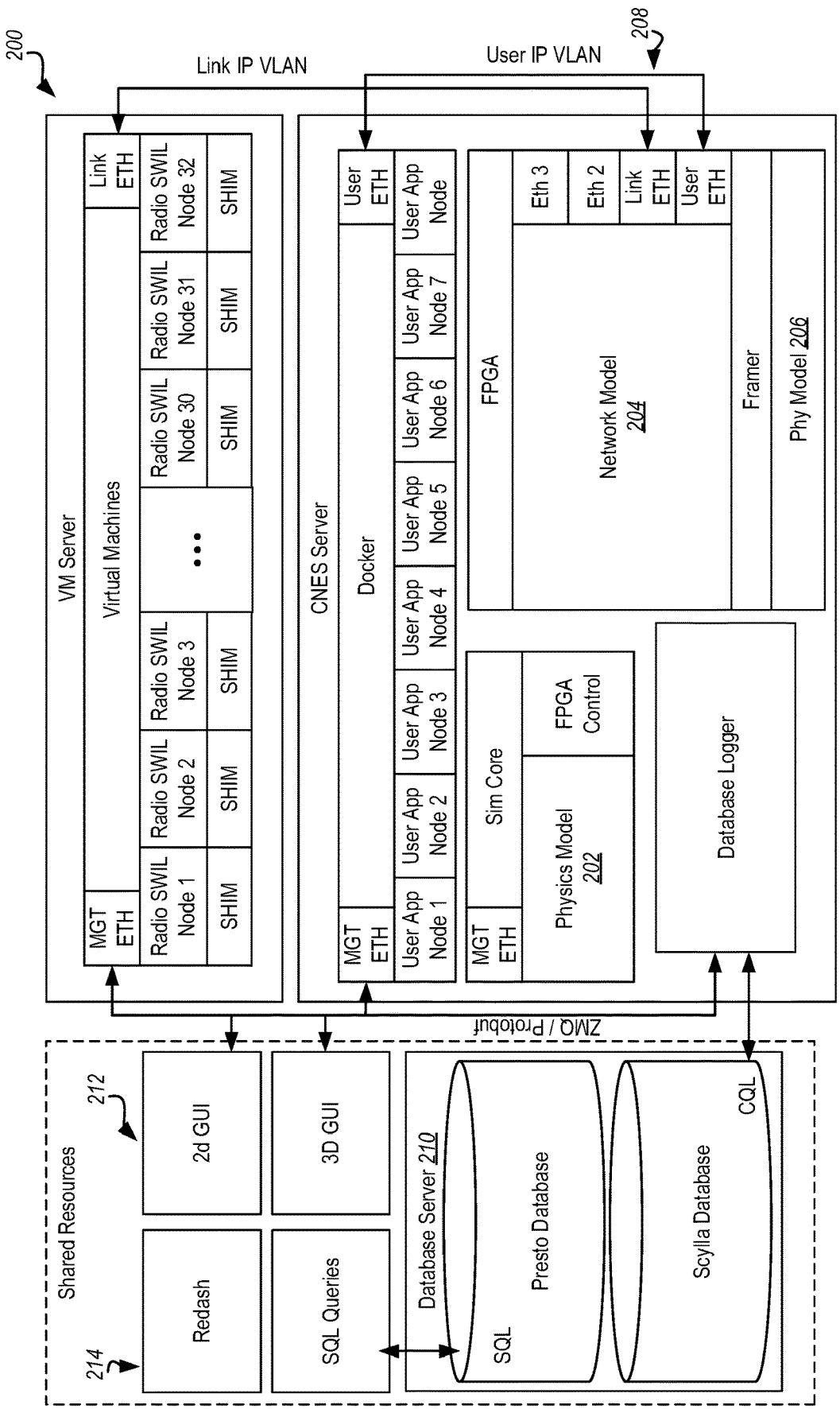
FIG. 2 illustrates additional details of the hardware system.

For example, with reference to FIG. 2, envision a scenario where a large amount of data is to be transferred from User App Node 1 to User App Node 7. Because an ad-hoc, peer-to-peer, mesh network is being simulated, it can be imagined that the data will pass through several other nodes on its path from User App Node 1 to User App Node 7. For this example, assume the data passes through User App Node 3 and 5. Further assume that the data will pass through several of the Radio Nodes. In this example, the data will be stored in a register. Metadata can be generated indicating latency, jitter and losses from node to node. Rather than requiring that the actual user data be physically moved on a data plane model, the metadata can be applied as appropriate to simulate the movement. At any point along the way when the actual data is needed by a node, the data can be provided by supplying a pointer which points to the single register location where the actual user data is stored. In this way, rather than needing to physically move a large amount of data, small amounts of metadata and a small pointer can be transferred as needed, thus reserving device resources for increasing capacity.

Protected networked RF communication (protected comms) are highly dynamic tactical wireless networks that can operate in permissive, contested or denied environments. Networked platforms can be mobile and/or static and operate in air, land, sea, and space. Protected comms features include autonomous distributed control, self-forming networks, self-healing networks and/or anti-jam (AJ) low probability of detection (LPD) RF Communications. Protected comms networks need to support scaling from low to high numbers of nodes. All while supporting the forwarding of data from applications attached to the network. Protected comms networked nodes are highly integrated where any one feature of the network has the potential to affect all other aspects of the network.

Often, simulation is relied on in developing new generations of protected comms. Because of the highly dynamic nature of protected comms, software and hardware, platform dynamics, radio and antenna features, electromagnetic effects, and waveform characteristic all need to be taken into account when testing. To account for this, embodiments implement a custom tool for virtual flight testing by augmenting, with simulation, network platforms, and system software and hardware that are otherwise unavailable or impractical to use. The tool does this through real-time software in the loop (SWIL) and hardware in the loop (HWIL) hardware accelerated simulation. Using the tool, continual system integration and test is possible throughout the life cycle of the protected comms solution.

Most industry standard communication simulation tools are designed to analyze theoretical system performance by characterization and modeling of the key system components. However, this does not provide analysis of measured system performance of real system components. Some embodiments illustrated herein allow for incorporating actual key protected comms components into a simulation environment to analyze measured system performance. This process of augmenting system software and hardware that is otherwise unavailable is known as software and hardware in the loop (SW/HWIL) simulation. With SW/HWIL the tool allows for continual integration, test and verification through the entire life cycle of a program. By using industry standard tools in conjunction with some embodiments illustrated herein, theoretical system performance can be compared to the systems actual measured performance prior to field testing.

Functional analysis, system testing, verification and validation of protected comms is intended to ensure the system meets user mission success criteria and program requirements. Because protected comms must provide robust communications while mitigating the effects of electronic warfare or other intentional interference threats, verification must be done in the environment that the system is intended to operate. Because of this jamming and detection threats are run in the tool environment.

High fidelity modeling of essential subsystem software and hardware components can be accomplished using some embodiments illustrated herein.

As will be illustrated in more detail below, embodiments include the performance and scalability to include all system components for validation and/or testing of a concept of operations. As noted previously, this can be accomplished using real-time software in the Loop (SWIL) and hardware in the loop (HWIL) integration. Further, embodiments can facilitate mission data analysis through relational logging and database systems. Embodiments allow for simulation that overcomes real world practical constraints such as availability of system hardware, vehicles, aircraft, and threats. Security restrictions also often prevent the use of classified waveforms, and countermeasures, such that embodiments illustrated herein can nonetheless perform testing without the use of such waveforms and countermeasures.

Referring now to FIG. 2, an example tool 200 is illustrated. The tool 200 is separated into several interdependent and interchangeable components: RF/physics models 202, network models 204 for modeling communications channels, datalink/phy models 206 for modeling a physical layer, SWIL/HWIL interfaces 208, databases 210 and visualizations 212. In this example, the RF/physics models 202 may be included in a software simulator, such as software simulator 102, while the network models 204, datalink/phy models 206, and interfaces 208 may be included in tool hardware, such as tool hardware 106. FIG. 2 illustrates an interface 207 that couples the RF/Physics models 202 to the hardware processors used to implement the network model 204 and the data link/phy models 206.

The tool 200 supports high fidelity modeling of subsystem SW/HW components. Some embodiments of the tool 200 model can model a complete system including: user applications, networking, hardware enabled model antenna patterns, modems, framers, routers, modulated waveforms over the air, RF equipment, RF losses, etc. and RF propagation channels. Some embodiments of the tool 200 include interference, multipath, and physical environment algorithms.

Embodiments of the invention can be implemented to perform and scale to include all systems, threats and physical environments for a given concept of operations. Some embodiments use custom simulation processors which provide hardware assisted algorithmic processing capabilities. Hardware assisted simulation provides high fidelity, high node count, and high throughput simulation of complex RF systems in real time.

Because of the custom simulation processors, embodiments are capable of modeling the complexities of various waveforms, at appropriate block sizes in real time. This is done to properly emulate system performance as well as allow for SW/HWIL.

Embodiments use light weight high capacity databases 210 that support large scale simulation logging in the lab or single entity logging in the field. All phases of development can be evaluated using the same relational analysis tools 214. Development phases from critical design review to user trials can be analyzed and compared against each other.

In some embodiment, model-based system engineering includes three main phases. The first phase is baseline simulation. This is input based on user concepts of operation and mission success criteria. Output includes validated concepts of operation and system requirements. Functional requirements are derived to achieve system functional performance objectives to meet overall mission needs.

The second phase includes the development of SWIL/HWIL Interfaces. In the early development phases of a project, software and hardware components do not exist, but are simulated. Real functional components replace simulation components as they become available during the system development cycle. This process of replacing simulated models with real SW/HW functional components enables continuous system integration along with continuous evaluation of system functionality and performance throughout the development cycle. Continuous integration and validation helps to discover system defects early in the design cycle leading to early problem resolution, and superior system solutions that best meet user mission needs.

The third phase includes instrumented field/flight testing. Embodiments illustrated herein provide an instrumentation, logging, and database system that is common to both the simulation and flight test environment. Data collected during simulation is analyzed and used to optimize system functional components. Flight data is used both for system analysis and is cross-correlated with that of the simulated models to provide validation of those models.

Users can leverage the tool 200 as a Verification and Validation (V&V) tool throughout any development programs. Concepts of operations can be tested and matured through iterative simulation runs. Statistics logged to the tool databases can be analyzed to evaluate system performance against mission success criteria. the tool visualization capabilities provide situational awareness and performance metrics for mission users, operators, and for post analysis of system performance.

In an actual environment, various factors will come into play. In general, most of these factors can be divided into one of two categories. The first category of factors applies to fast changing factors. In particular, these fast changing factors can be conceptualized as factors that are constantly and continuously changing. Sometimes, these factors are referred to as applying to periodic processes or events. These processes are physics-based and can easily be computed by software-based computing systems so long as they can be computed at a certain speed depending on the application. These factors are generally nondeterministic meaning that they are somewhat random in nature and generally are not repeatable simply by applying the same inputs into a system. That is, these factors exist on a continuum of change. These factors are independent of particular data packets, meaning that their duration is not defined on a packet basis. For example, such factors may include geometry changes, path losses, changes in an environment that will obstruct RF waveforms such as changes in terrain or wing obstructions on an aircraft, weather conditions, temperature changes of radios and other hardware, differences between polarization of transmitting antennas as compared to polarization of receiving antennas (where cross polarization represents a worst case scenario), distance between transmitters and receivers, noise and other interference (including jamming interference), and other continuously changing factors. Note that items in the first category of factors are typically less time dependent with respect to data in a waveform, meaning that the modeled factors do not need to correspond to specific packets or frames of data such as specific forward error correction blocks or other data packets.

The second category of factors are referred to herein as slow changing factors. These factors are often not continuously changing, but rather represent discrete events that are controlled in discrete ways and tend to be constant for certain periods of time. Indeed, often these factors are intentionally changed by system or manual intervention at certain times to achieve certain specific results. As an example, this may include the power at which an RF waveform is transmitted. Alternatively, or additionally, this may include the bit rate and/or chip rate at which data is transmitted. Alternatively, this may include the frequency at which an RF waveform is transmitted. In contrast to the first category of factors, the second category of factors are time-dependent with respect to data in a waveform. That is, in some embodiments, these factors are dependent on particular data packets, meaning that they persist for a time period corresponding to particular data packets. In particular, certain forward error correction blocks, or other packets, need to correspond to a particular power and/or rate. That is, when a simulation is performed, certain packets will be sent at a certain power and/or a certain rate and thus the tool needs to model those packets at the correct power and/or rate. If these factors are not modeled in the appropriate location of a waveform, inaccurate modeling occurs as packets and other discrete data units will not be modeled at the correct power and/or rate. For example, a user may wish to model a situation where power is reduced to avoid detection of a waveform. However, if that portion of the waveform is modeled at an incorrect power with respect to the simulation, the simulation may indicate that the waveform was able to be received when in fact the power was too low given other factors to be received. Thus, it is important for accurate simulation that power and/or rate appropriately correspond to specific data in a waveform.

Computing these factors in a simulation is often a complex operation that would be difficult to perform using the tool hardware 106. However, as noted above, latency, jitter, and losses are modeled by the tool hardware 106. To accomplish this, a waveform energy to noise energy ratio needs to be computed to compute a link budget which is used in determining probability of loss. That is, embodiments can predict if a payload will be received, or if payload will be dropped. For example, as described previously, the receive processor 114 can use the link budget information to determine if a packet should be dropped, and then to simulate the packet being dropped.

Waveform energy to noise energy may often be expressed as the ratio $E_b/N_0$ (which is the ratio of energy per bit to noise spectrum density) or $E_s/N_0$ (which is the ratio of energy per symbol to noise spectrum density). Note that symbols may include multiple bits, such as for example where a quadrature phase shift keyed symbol includes four bits. To compute the waveform energy to noise energy ratio requires combining portions of the slow factors with the fast factors. That is, the fast factors represent a best-case scenario for waveform energy to noise energy in an environment and the slow factors represent a reduction in the best-case scenario. Thus, if the fast factors can be quantified and the slow factors can be quantified, the overall waveform energy to noise energy can be computed by simply subtracting the slow quantity from the fast quantity.

Figure 3:
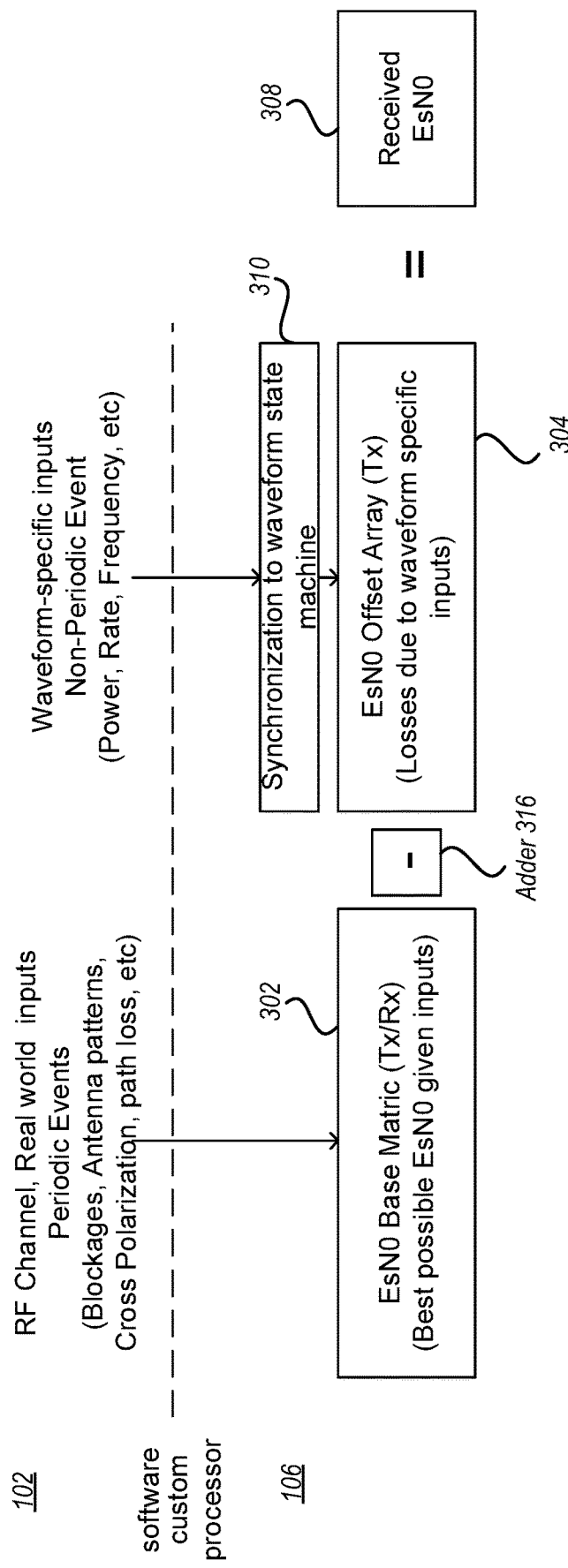
FIG. 3 illustrates details with respect to determining link budgets.

Referring now to FIG. 3, some embodiments illustrated herein are able to accomplish this combination by using a so-called base matrix stored in a first hardware register 302 for fast factors and a so-called offset matrix (which in some embodiments may be simply an array) stored in a second hardware register 304 for slow factors. The base matrix identifies the best possible waveform energy to noise energy ratio (shown as $E_s/N_0$ in FIG. 3) given the current environmental conditions modeled by the fast factors. Note that the fast factors will include factors related to both transmit and receive modeling while the slow factors will include factors related only to transmit modeling. The fast factors are independent of particular data packets, while the slow factors are specifically tied to particular data packets.

The fast factors and slow factors can be provided by the software simulator 102 using the physics model 104 to the tool hardware 106 such that the tool hardware 106 simply needs to perform a subtraction function using a hardware adder 306 to combine the fast and slow factors to model an environment and an associated waveform in the environment. Note that adders are particularly suited for specialized hardware such as FPGAs and similar logic-based hardware. That is, an adder will typically be comprised of hardware logic gates and timing circuits, which are fundamental to logic-based hardware often used for implementing the tool hardware 106. Thus, addition (and subtraction) is a function particularly suited for hardware, such as that used in implementing the tool hardware 106.

Losses, for use in simulations, can be determined by using a calculation or by calculating waveform energy to noise energy ratio and looking up in a table to identify probability of loss. Thus, for example, the received waveform energy to noise energy ratio 308 can be used in an additional computation or can be used as a key in a table look-up to identify probability of loss when simulating loss, jitter, and latency using the tool hardware 106.

Embodiments can further be used to identify link budgets by identifying a waveform energy to noise energy ratio. That is the tool hardware 106 can compute an waveform energy to noise energy ratio, and then use a table to identify the probability of loss to identify the link budget.

Note that the software simulator 102, using the physics model 104 can pre-calculate and store base matrix values for various points in time, because generally there is no need to worry about synching up with a data waveform. That is, the matrix is used to handle elements of the environment that do not need to be synchronized with the waveform. In contrast, the offset matrix values need to be provided at the appropriate time to the tool hardware 106 to correspond to particular portions of the data waveform. Thus, as illustrated in FIG. 3, synchronization hardware 310, in this example implemented as a state machine, may be provided to synchronize the offset matrix with specific data inputs. For example, the state machine can synchronize data packets to the slow factors of the offset matrix.

Figure 4:
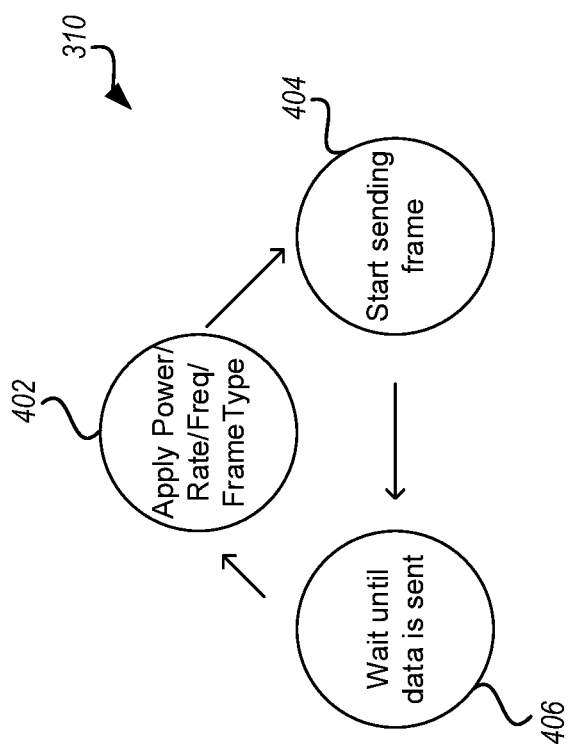
FIG. 4 illustrates a state machine used for determining link budgets.

For example, additional details with respect to one example of the synchronization hardware 310 is illustrated in FIG. 4. FIG. 4 illustrates the synchronization hardware 310 as a state machine with three states. The first state 402 applies power, rate (e.g., bit or chip rate), frequency, and/or frame type information to specific portions of a waveform (usually a specific packet or set of packets). After the first state 402 applies power, rate, frequency, and/or frame type information to specific portions of a waveform, the second state 404 causes data to be sent with the power, rate, frequency, and/or frame type information applied. The third state 306 waits for all applicable data to be sent. The state machine then moves to the first state 402 again to apply potentially different power, rate, frequency, and/or frame type information to different data in a waveform.

Figure 5:
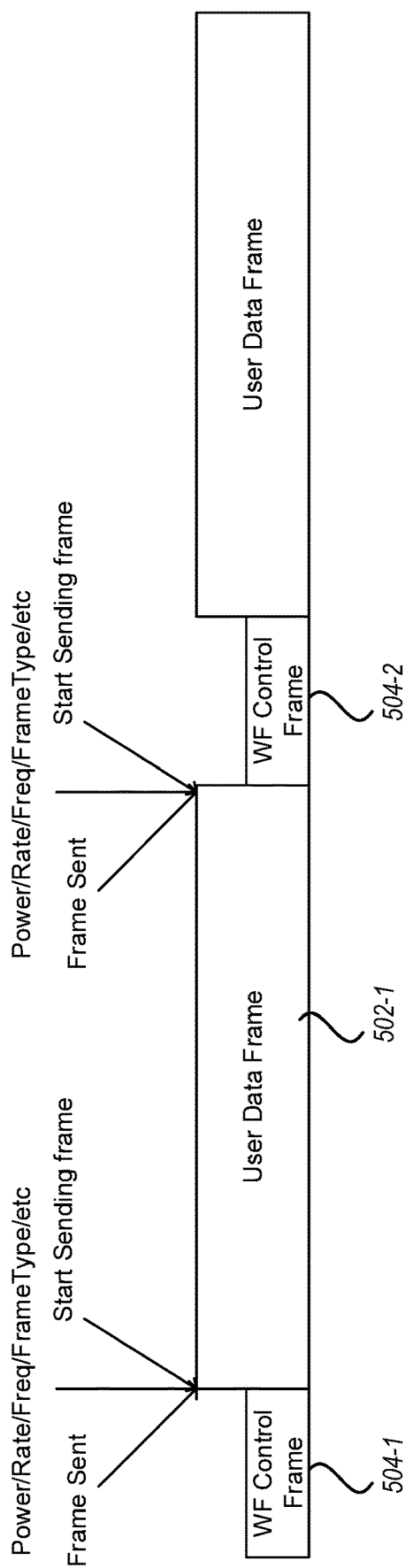
FIG. 5 illustrates data frames with added control frames.

In some embodiments, the functionality described above with respect to applying power, rate, frequency, and/or frame type to particular portions of data may be facilitated by use of a specialized control frame, which is a header inserted into a packet or frame of a waveform which includes information identifying power, rate, frequency, and/or frame type. An example of this is illustrated in FIG. 5 which shows a user data frame 502-1 and a control frame 504-1. The state machine illustrated in FIG. 4 operates at the boundary(s) between data frames and control frames. For example, as illustrated in FIG. 5, waiting until a frame is sent, applying power/rate/frequency/frame type information, and starting to send a frame are all performed at the boundary between the control frame 504-1 and the user data frame 502-1. Note that in some embodiments, portions of the state machine may operate at different boundaries, such as between a previous data frame and a current control frame, rather than a current control frame and a current data frame. For example, waiting until a frame is sent may occur at the boundary of the control frame 504-2 and the user data frame 502-1, while applying power/rate/frequency/frame type information, and starting to send a frame are both performed at the boundary between the control frame 504-2 and the user data frame 502-2.

Thus, in some embodiments, simulation software (e.g., the software simulator 102) performs the link budget calculations required for accurate waveform modeling on a general-purpose processor, and a custom processor (e.g., the tool hardware 106) handles all waveform data plane processing. The link budget calculation can then be used to determine if a packet will be dropped or not. In particular, if the link budget will not support a particular data rate, then the tool hardware 106 simulates dropped data.

The following is an alternate description of embodiments synchronizing the link budget calculations made by the software with the waveform state machine running on the custom tool hardware 106. Each link budget calculation is divided into two portions: an RF-spectrum portion (antenna gains, propagation loss, platform dynamics, interference, etc.) and a waveform specific portion (transmit power, rate, frequency etc.). The computationally intensive RF-spectrum calculations are not dependent on the current state of the waveform model, and are performed and communicated to the tool hardware 106 at a constant periodic rate. The waveform specific portion of the link budget calculations, although not computationally intensive, are highly dependent on the state of the waveform model and are calculated and passed to the tool hardware 106 on demand. The tool hardware 106 then combines these two portions of the link budget, allowing for highly synchronized link budget and waveform modeling. The software of the software simulator 102 running on a general-purpose processor runs open loop, and independent from the waveform state machine implemented on the tool hardware 106. This leverages the CPU-based software complex computational strengths with a custom waveform processor-based state machine, resulting in highly precise discrete timing. Thus, embodiments can be implemented where an event engine is not needed for applying power, rate, and/or frequency factors when computing link budgets. Rather, the waveform can be used to control a state machine such that a hardware-based state machine can be used to apply power, rate, and/or frequency factors to the waveform.

The following now illustrates details with respect to some embodiments where the tool hardware is implemented as a custom processor with an architecture specifically implemented for modelling waveforms in a data plane. In particular, custom hardware is expensive to design and fabricate particularly when such hardware is designed and fabricated for a specific type of waveform or data plane. Thus, embodiments illustrated herein can implement the hardware in a fashion where opcodes and registers can be used to configure the tool hardware 106 for specific types of waveforms and/or specific data plane characteristics. That is, a low-level programming language, having waveform processing specific semantics, and custom register hardware, also having specific waveform processing specific semantics, can be implemented for programming the tool hardware 106. Thus, embodiments can write control bits to a series of registers with opcodes. The control bits may define a type of block to be sent, types of inputs to be implemented, timing for how long data is supposed to remain over the air, number of data channels to be implemented, whether or not the channels can be correlated, that certain types of blocks need to be received before other types of blocks are received, that a receiver needs to be in a certain state before making an acquisition or dropping a link, etc.

Note that in some embodiments, the architecture allows control of both transmit and receive operations on the data plane.

This allows for the tool hardware to be implemented without the need to recompile the hardware for each different scenario. Rather, embodiments can simply switch from scenario to scenario with simple register changes and opcode commands. Additionally, multiple different waveforms can be simulated on the same hardware in a single simulation, because the hardware is programmable. Thus, embodiments may include tool hardware that includes opcodes and registers specifically for waveform operations. This allows for modelling features, countermeasures, and modes.

Figure 6:
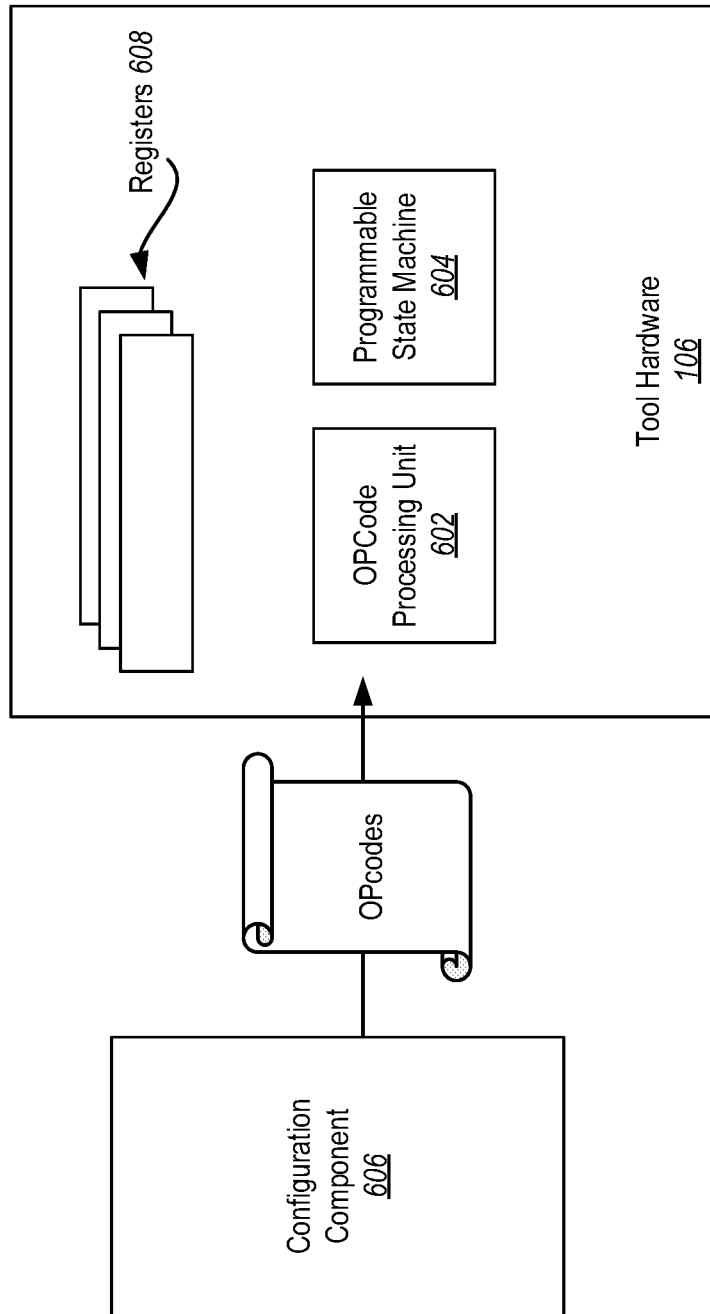
FIG. 6 illustrates details with respect to embodiments using opcodes for programming the hardware system.

Referring now to FIG. 6, embodiments include a first component implemented as a configurable state machine 604, which is built into the tool hardware 106. As noted above, the tool hardware 106 may be an FPGA, CPLD, ASIC or other appropriate hardware. This component includes an opcode processing unit 602 and the programmable state machine 604. The opcode processing unit 602 accepts opcodes from an external source. These opcodes are used to configure the programmable state machine 604. The programmable state machine 604 is designed to operate in a variety of modes. For example, in one mode example, the state machine may be programmed to operate as simulated transmitter in a communications system. Alternatively or additionally, the state machine may be programmed to operate in a mode as a simulated receiver. Alternatively or additionally, the state machine may be programmed to operate in a mode as a transmitter programmed as a TDMA (Time-Division, Multiple Access) device, or as a continuously transmitting, always on device. Alternatively or additionally, the state machine may be programmed to operate in a mode as a simulated receiver that is programmed to acquire/drop a data link based on various programmable conditions. Alternatively or additionally, the state machine may be programmed to operate in a mode as a simulated receiver configured to acquire a datalink after receiving a certain type of forward error correction (FEC) block, while another mode acquires a datalink after receiving multiple FEC blocks of the same type, thereby building confidence that the datalink is good.

Embodiments also include a second component referred to herein as a configuration component 606: This configuration component 606 exists outside of the tool hardware 106. The configuration component 606 provides a set of opcodes to the programmable state machine 604 in the tool hardware 106.

A scripting language provides functionality for programming the physical layer framing and timing characteristics that define a waveform model. This approach facilitates the rapid development of emulated waveforms, including such items as framing and timing, within a simulation environment. Each instruction in the script contains an opcode and opcode specific fields to provide instructions to the opcode processing unit 602 of the tool hardware 106.

The following illustrates a number of opcodes that may be implemented.

One opcode includes a noop, which is an opcode that indicates nothing should be performed.

Another opcode is an opcode that indicates that the processing at the state machine at the tool hardware 106 should wait for input before proceeding, such as an input from another processor, from a particular channel, etc.

Another opcode is an opcode that indicates that the processing of the state machine should go to an address.

Another opcode is an opcode that indicates that the processing of the state machine should go to an address on an event.

Another opcode is an opcode that indicates that the processing of the state machine should go to an address based on what is in a register.

Another opcode is an opcode that indicates that the processing of the state machine should get the address where processing is currently.

Another opcode is an opcode that causes a register to be set.

Another opcode is an opcode that causes registers to be compared against each other.

Another opcode is an opcode that causes a register to be compared against arguments in a script.

Another opcode is an opcode that causes outputs to be set.

Another opcode is an opcode that indicates that the processing of the state machine should go to an address if a comparison is equal.

Another opcode is an opcode that indicates that the processing of the state machine should go to an address if a comparison is not equal.

Another opcode is an opcode that indicates a single clock cycle pulse should be emitted.

The following illustrates an example of a routine that might be implemented using an opcode script using opcodes specifically configured for modelling sending data, from a node, on a physical layer and communication channels, where each line represents a specific opcode:

Identify block type (e.g., user data block)
    Send out pulse to lock rate and commit lock
    Send pulse that indicates that rate is locked in
    Send block
    Wait for block to be sent
    Perform other logic while waiting
    Start over Similar, but complementary scripts can be implemented for simulating receive nodes as well. For example, a script could be written to determine if a connection will be terminated, a packet will be dropped, or other receive actions.

Embodiments further include a number of specialized registers 608 specific to waveform simulation. The following illustrates a number of registers that may include the hardware tool 106 for simulating data transmission.

Embodiments may include an enable register which can have a value set to indicate that the state machine 604 is to start running.

Embodiments may include a register which can have a value set indicating that the system is ready for a next command.

Embodiments may include a register which can have a value set indicating that the system is ready for a data rate (e.g., bit rate or chip rate) change.

Embodiments may include a register which can have a value set indicating that the system is ready for a length change for setting a number of times that a block is sent.

Embodiments may include a register which can have a value set indicating a synch request to synchronize different channels when synchronization is needed.

Embodiments may include a register to indicate that specific data should be latched in at the end of a block or block type in preparation for a next cycle of a state machine.

Embodiments may include a register which can have a value set indicating a beacon request for synchronization logic between different channels. For example, the beacon could indicate that while one channel is doing certain tasks, a corresponding channel should be doing other specific tasks.

Embodiments may include a register which can have a value set with logic for starting to send a new block.

Embodiments may include a register which can have a value set indicating that the system is finished sending a certain block.

Embodiments may include a register which can have a value set indicating that logic attached is busy doing other tasks, so that the system needs to wait until those tasks are completed.

Embodiments may include a register which can have a value set indicating that something has occurred since last time the register was checked.

Embodiments may include a register which can have a value set indicating that interrupts should be sent to the processor.

Embodiments may include a register which can have a value set indicating a command to send a data block.

Embodiments may include a register which can have a value set indicating that the state machine is done with some task.

Embodiments may include a register which can have a value set indicating that a waveform model should lock in power and rate for a signal.

Embodiments may include a register which can have a value set indicating the type of block that is supposed to be sent out next.

Embodiments may include a number of registers that can be used for data storage.

Similar registers are implemented for receive operations. For example, embodiments may include one or more of the following:

The following are input registers that external sources can be used to input data into the state machine.

Embodiments may include a register which can have a value set indicating that a new block that has been received and needs to be processed.

Embodiments may include a register which can have a value set indicating that there is an error in sequencing of data blocks.

Embodiments may include a register which can have a value set indicating that an incoming data block was dropped.

Embodiments may include a register which can have a value set indicating that a receiver can stay connected to a particular transmitter.

Embodiments may include a register which can have a value set indicating that an interrupt should be sent when a receiver obtains a connection.

Embodiments may include a register which can have a value set indicating what nodes data is being transmitted from and/or received from. In other words, this can indicate to the state machine 604 what node the state machine 604 is acting as.

Embodiments may include a register which can have a value set indicating a block type. For example, some embodiments can have a register that sets block types such as Preamble, Header, Payload data. In another example, block types may be defined according to the IEEE 802.11 standard to define Management frames, Control frames, Data frames, and/or extension frames. Indeed some embodiments may be able to specify a block type and one or more sub types.

Embodiments may include a register which can have a value set indicating a channel type (e.g., is the channel beacon channel for finding other nodes, or is the channel a traffic channel for transmitting user data).

Embodiments may include a register which can have a value set indicating that a connection to a transmitter should be terminated.

Embodiments may include a register which can have a value set facilitating interactions between different channels staying in synchronization.

The following are output registers for the receive functionality.

Embodiments may include a register which can have a value set indicating a reset and initialization of surrounding logic.

Embodiments may include a register which can have a value set indicating that processing is done and ready for a new command.

Embodiments may include a register or an output to a FIFO buffer which can have a value set indicating processing a block has finished and that the state machine is ready for a new block to process.

Embodiments may include a register which can have a value set indicating to logic a need to establish a connection to a node or drop a connection to a node.

Embodiments may include a register which can have a value set indicating the confidence that link can be kept up or should be taken down. The register can be incremented or decremented according to a determined confidence.

Figure 7:
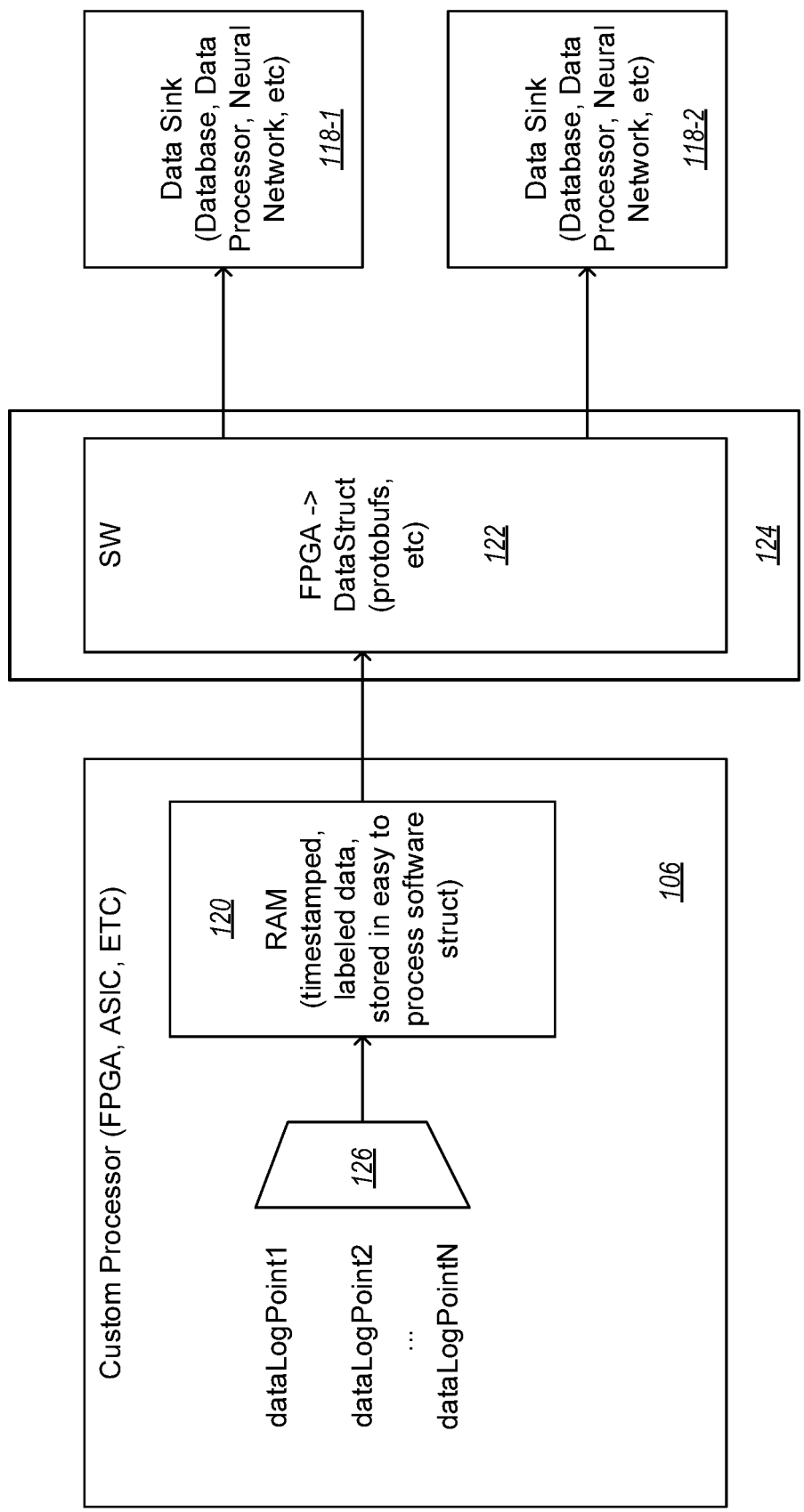
FIG. 7 illustrates details with respect to capturing large amounts of data produced by the hardware system.

Referring now to FIG. 7, embodiments may include functionality for providing large quantities of data from the tool hardware 106 to various large-scale data storage and/or data processing elements, illustrated herein as data sinks 118-1 and 118-2, although any number of data sinks may be implemented. Embodiments are typically implemented such that large amounts of data are being generated very quickly. In particular, high-speed data communications, and modeling of such, means that large amounts of data are generated to simulate the corresponding environmental and/or other conditions. For example, consider that each frame may have power, rate, and/or frequency associated with it, along with timing information indicating when the frame was sent, received, dropped, etc. If large numbers of frames are sent, a correspondingly large amount of power, rate, and/or frequency data and timing information is generated.

In order to verify a model being simulated, that data will need to be collected and analyzed. As such, some embodiments include functionality for providing input into other types of tools to do reduction and analysis on a simulated model. For example, in some embodiments, data may be fed into data sinks (e.g., data sink 118-1) which implement machine learning tools, which can perform automated analysis of the data. Alternatively, or additionally, data may be stored in large databases for later review and analysis.

To accomplish the data collection, the tool hardware 106 adds log type data to a Random Access Memory (RAM) 120 at the tool hardware 106. This log type data may include a history (as discussed in more detail below) of what is transpiring on the tool hardware 106. This is done by collecting data in blocks, which are then converted and are stored in the RAM 120 as software defined structures such that the tool hardware 106 and software 122 (although, it should be appreciated that the software 122 is implemented on a computing system 124, such that an external computing system 124 executing the software 122 reads data in the RAM 120) communicating with the tool hardware 106 both utilize data written using the same software defined structures, to perform periodic large batch reads. This allows the software 122 to directly access data in the large blocks from the RAM 120. For example, in some embodiments, protocol buffers (sometime referred to as protobufs) and corresponding reflection may be used for storing the data to the RAM 120. Other software defined structures may be used alternatively, or additionally. For example, in some embodiments, the data stored in the RAM 120 is a custom format. For example, embodiments may implement a bit-packed field where specific bits represent different data fields. For example, assume a 32-bit word 0x00010002 (hexadecimal representation). Bytes 0-1 (0x0001) may represent the transmitter's node ID, while bytes 2-3 (0x0002) may represent the receiver's node ID. After the data from the RAM has been sent to the processor, the processor parses bit-packed fields and translates them into a software-defined structure such as a protobuf, which can be inserted into a 'data sink' such as a database for future analysis. Note that in other embodiments, structures such as XML structures, flat files, JSON structures, .csv files, .doc files, .xls files, encrypted files, etc. may be implemented.

Embodiments can burst data into the RAM 120 into smaller data structures to create tables automatically or inputs compatible with other systems. In some embodiments, multiple tables and/or other inputs can use a single protobuf file.

Data is provided from the RAM 120 to the software over an appropriate interface, such as a processor bus, such as PCI-Express. Alternatively, or additionally, the data from the RAM 120 may be transferred to the software 122 using ethernet. Alternatively, or additionally, the data from the RAM 120 may be transferred to the software 122 using direct memory access (DMA). Other appropriate interfaces may be used for transferring data from the RAM 120 to the software 122. In particular, the software 122 will read data in the RAM 120 to an external data sink, such as one or more data sinks represented at 118-1 and 118-2 in FIG. 6. As noted previously, a data sink may be a database, data processor, neural network, or other appropriate data handler.

As noted previously, the tool hardware 106 has a software accessible RAM 120. The RAM 120 stores logging inputs from the tool hardware 106. Note that access to the RAM can be provided by other hardware in the tool hardware 106 through a multi-point data switch 126. The multi-point data switch 126 has multiple data access points, where each access point is coupled to different pieces of hardware in the tool hardware 106 to collect data for specific hardware. For example, embodiments may have connections to various hardware locations in the tool hardware 106 to collect states of various state machines in the tool hardware 106. Alternatively, or additionally, embodiments may have connections to various hardware locations in the tool hardware 106 to collect information identifying the order that communication messages are sent. Alternatively, or additionally, embodiments may have connections to various hardware locations in the tool hardware 106 to collect information identifying communication messages that were transmitted by a modeled sender node. Alternatively, or additionally, embodiments may have connections to various hardware locations in the tool hardware 106 to collect information identifying communication messages that were received by a modeled receiver node. Alternatively, or additionally, embodiments may have connections to various hardware locations in the tool hardware 106 to collect information identifying communication messages that were dropped by a modeled receiver node. Alternatively, or additionally, embodiments may have connections to various hardware locations in the tool hardware 106 to collect information identifying base waveform energy to noise energy ratio for communication messages. Alternatively, or additionally, embodiments may have connections to various hardware locations in the tool hardware 106 to collect information identifying offset waveform energy to noise energy ratio for communication messages. Alternatively, or additionally, embodiments may have connections to various hardware locations in the tool hardware 106 to collect information identifying combined waveform energy to noise energy ratio for communication messages. Alternatively, or additionally, embodiments may have connections to various hardware locations in the tool hardware 106 to collect information identifying a discrete time when communication messages were received. Alternatively, or additionally, embodiments may have connections to various hardware locations in the tool hardware 106 to collect information identifying a discrete time when communication messages were dropped. Alternatively, or additionally, embodiments may have connections to various hardware locations in the tool hardware 106 to collect information identifying the amount of time to send a communication message. Alternatively, or additionally, embodiments may have connections to various hardware locations in the tool hardware 106 to collect information identifying latency information for communication messages. Thus, in some embodiments, at least some collected data is correlated with time stamps. This allows embodiments to reconstruct what happens in the tool hardware 106 during modelling. Using this functionality, some embodiments can therefore replay time stamped events and validate models using this data.

Note that in some embodiments, the data may be collected from various registers in the tool hardware 106, converted to an appropriate data format (e.g., protobufs), and stored in the RAM 120.

The multi-point data switch 126 has the ability to be turned on or off on a point basis. For example, if the tool hardware 106 is producing more data than can be handled by the software, then the functionality for one or more point can be turned off so as to not overwhelm the software. That is, the tool hardware 106 has the ability to select whether or not logging inputs are stored to RAM. As noted, this can be done on a point by point basis. Thus, for example, a log point logging time to send messages can be turned off while a log point logging dropped messages remains on.

Note that embodiments allow for post analysis of data, which may not be otherwise possible because data is produced so quickly. Previous systems required analyzers which monitored various clocks and gates without the ability to store data for later analysis.

Thus, some embodiments include functionality for providing a high-volume logging capability to a system that contains the custom tool hardware 106 (where the custom tool hardware may be an FPGA, CPLD, ASIC, or other hardware device) to a database or other data sink (see e.g., data sinks 118-1 and/or 118-2) for development, analysis, and verification. Using this functionality, timestamped data from different internal sources is collected in a temporary buffer in the custom tool hardware 106. Once an amount of collected data exceeds a predetermined threshold, once a predetermined amount of time has elapsed, and/or based on other factors, the data is transferred from the RAM 120 in the custom tool hardware 106 to a database or other data sink (see e.g., data sinks 118-1 and/or 118-2) in a single burst. This may be accomplished by transferring the data directly from the custom tool hardware 106 to the database over a medium such as Ethernet. Alternatively, or additionally, this may be accomplished by sending collected data to a general-purpose processor as an intermediate step. In some embodiments, each piece of data entered in to the database has a unique key and timestamp to allow for easier data analysis.

Some embodiments illustrated herein include functionality for modeling a plurality of hardware routers as virtual routers in a single tool implemented by the tool hardware 106 by using hardware components in the tool hardware for multiple nodes. In particular, a single set of hardware can be used to model routers for various different nodes rather than requiring different routers for different nodes. As noted previously, and referring now to FIG. 8, in some embodiments, the data plane is modeled in the tool hardware 106 by a custom processor implemented in custom hardware such as an FPGA or custom ASIC. The data plane is managed by a software simulator 102 running on a general-purpose processor. Embodiments share hardware when possible to allow multiple network models (i.e., routers) to be implemented in a single piece of custom hardware by reusing physical gates and registers 806 in the hardware for different network models. This is accomplished by duplicating lookup portions of the router logic, while the data forwarding, queuing, and framing portions of the network model use common physical hardware across a plurality of simulated network nodes (see e.g., the user app models 108 and the radio models 109 for examples of nodes, and nodes illustrated generally at 804).

As discussed previously, embodiments illustrated herein route various volumes of network traffic at line rates. For example, such line rates may be 1 kbps to 10 Gbps, or other rates. Using the hardware tool 106, embodiments can process this high-speed data in real time as simulations are performed inasmuch as hardware components are used for modeling the data plane.

Embodiments can reuse hardware components in the tool hardware 106, and therefore do not need multiple instances of the tool hardware 106 with one set of hardware components dedicated to each node. While in some embodiments, hardware components can be replicated in the tool hardware 106, each instance of replication can be used for multiple nodes in a given simulation. Thus, embodiments can replicate functionality for a plurality of nodes without replicating logic hardware for that plurality of hardware. That is, nodes can be logically and digitally separated, even though hardware is shared. This is illustrated where a plurality of nodes 804 all use the same gates and registers 806 to model a network router.

Examples of hardware shared by different nodes in a same simulation include content addressable memory (CAM) tables, queuing tables to handle quality of service (QOS) queuing, and protocol translator tables.

CAM tables can be used to store data used for routing network data. For example, the CAMs may store IP address, ports, or other information needed for routing network data in a network. Data in a CAM decides where a particular packet is supposed to go.

As noted above, queuing tables are used to handle QOS requirements. For example, the queuing tables can be used to schedule data transmissions and processing to meet certain requirements for the data. Data in a queuing table determines when a packet can be sent.

Protocol translation tables can be used to perform proprietary framing operation to ensure data is properly routed. For example, data may be received on an ethernet port, but the data needs to be changed to different port. Data in the protocol translation tables can be used to strip the ethernet headers and to add Generic Framing Procedure (GFP) headers. Data in the protocol translation tables determines what a packet should look like when it gets sent.

Thus, a virtual router uses the same physical logic elements to get multiple logical instances of the same capability using reduced resources. This allows for the ability to scale simulations efficiently.

Note that in some embodiments, the system may be pipelined such that minimal buffering of network data from different nodes is required. For example, the gates and registers may only be provided data from a limited number of nodes, where the limit is determined by the probability of only being required to buffer data from one node at any given time.

Figure 8:
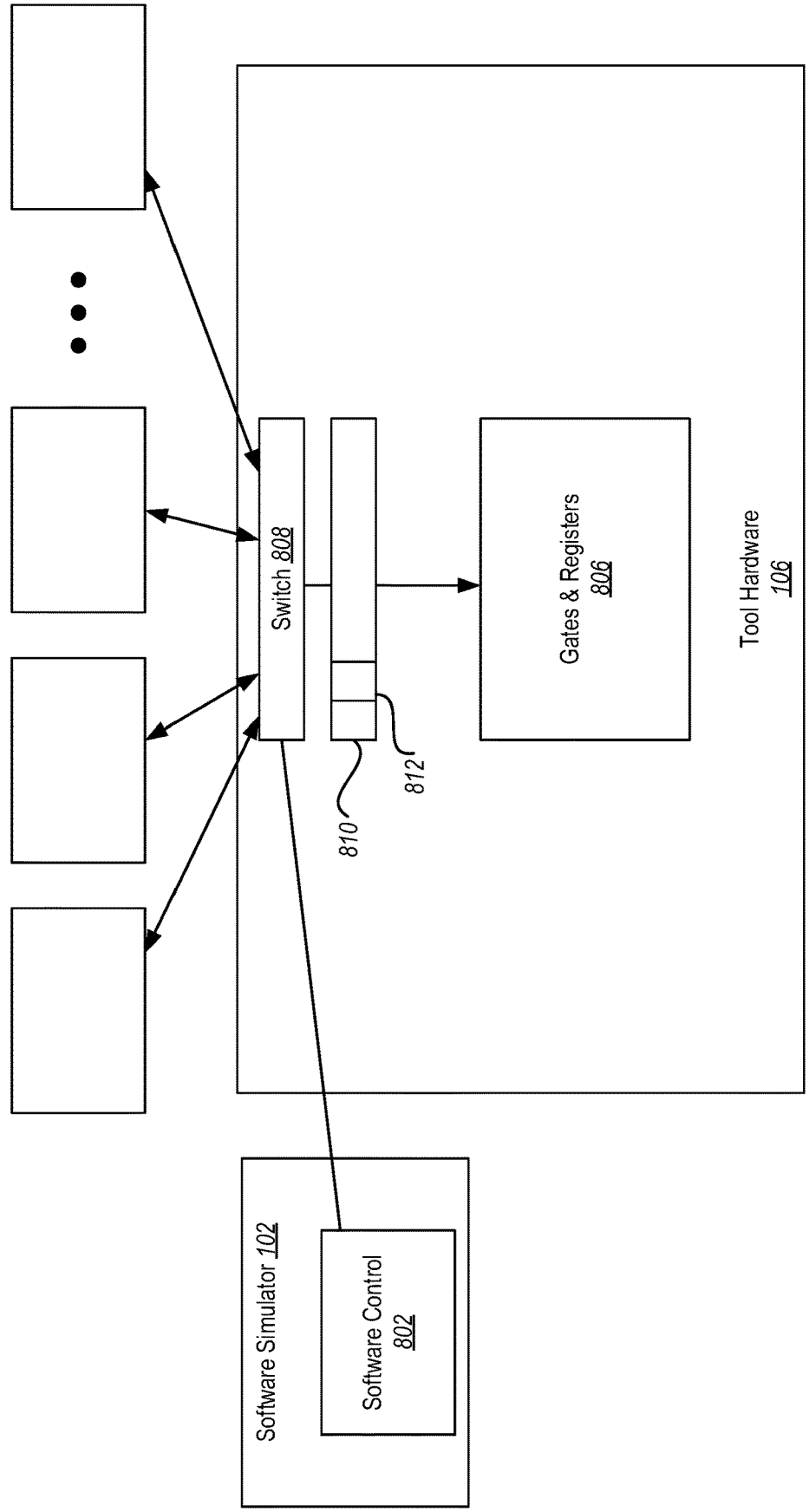
FIG. 8 illustrates details with respect to implementing a virtual router.

FIG. 8 illustrates that a software control 802 may be used to control a switch 808 to control which virtual router is being simulated depending on which node is providing or receiving network data. For example, some embodiments use a software defined three-bit code, which is able to be used to simulate eight virtual routers. In some embodiments, the code may be used to control direct connections of a node to the gates and registers 806. Alternatively, the code may be embedded in a custom header 810 that is added to data from the nodes. In this way, the gates and registers 806 can use the code in the custom header 810 to determine how data should be treated within the tool hardware 106.

Note that within a single tool hardware 106, multiple sets of gates and registers may be implemented. Thus, for example, if eight sets of gates and registers, similar to the gates and registers 806, were implemented, then a total of 64 virtual routers could be modeled. Note that these are merely examples, and other examples may have more or less routers per set of gates and registers and/or more sets of gates and registers.

Note that embodiments are implemented where when a packet comes in, it is tagged with code for the corresponding node that it came from or that it is intended to be routed to, by the software simulator 102. The custom header 810, that is not seen to outside world, has a node ID in the front of the actual packet. The node ID keeps network data appropriately separated.

Note that embodiments can share data stored in the gates and registers used for the CAM tables, queuing tables, and protocol translator tables. For example, addresses can be shared in the tables if those addresses are applicable to different nodes, but with the ability to send to different network interfaces, ports, etc., as appropriate. For example, information in the tables can be used to modify routing headers, which are normal headers seen in the outside world on simulated network data, such as header 812, so that they are modified for the correct port. For example, headers could be modified to go straight to an ethernet port, to a framer, modem, PHY simulation models, etc.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general-purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general-purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general-purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system for simulating lost data packets in a network simulation, the system comprising:
   a first hardware register configured to store data for fast factors, the fast factors comprising factors that are time independent with respect to particular data packets;
   a second hardware register configured to store slow factors, the slow factors comprising factors that are time dependent on data packets;
   synchronization hardware coupled to the second hardware register configured to synchronize the slow factors with specific data inputs based on dependencies on the data packets, wherein the synchronization hardware comprises a state machine with three states, where the first state applies the slow factors, the second state causes data to be sent with the slow factors applied, and the third state waits for applicable data that is to be correlated with the slow factors to be sent;

a hardware adder coupled to the first hardware register and the second hardware register to compute a link budget, wherein the link budget is used to determine probability of loss of data packets; and a hardware processor coupled to the hardware adder, the hardware processor configured to determine, based on the link budget, if a data packet should be dropped, and when the data packet should be dropped, to drop the data packet for simulating a network physical layer.

2. The system of claim 1, wherein the fast factors comprise one or more of antenna gains, propagation loss, platform dynamics, interference, geometry changes, changes in terrain, wing obstructions on an aircraft, weather conditions, temperature changes, differences pf polarization between antennas, or distance between transmitters and receivers.

3. The system of claim 1, wherein the slow factors comprise one or more discrete events.

4. The system of claim 1, wherein the slow factors comprise changes in signal power.

5. The system of claim 1, wherein the slow factors comprise changes in data rate.

6. The system of claim 1, wherein the link budget is expressed as the ratio $E_b/N_0$, which is the ratio of energy per bit to noise spectrum density, or $E_s/N_0$, which is the ratio of energy per symbol to noise spectrum density.

7. The system of claim 1, wherein a table comprising link budget entries is used to determine the probability of loss.

8. The system of claim 1, wherein the synchronization hardware uses a specialized control frame comprising a header inserted into a packet of a waveform which includes information identifying the slow factors, where the slow factors are to be applied to the packet into which the header is inserted.

9. A method of simulating lost data packets in a network simulation, the method comprising:

storing data for fast factors in a first hardware register, the fast factors comprising factors that are time independent with respect to particular data packets;

storing slow factors in a second hardware register, the slow factors comprising factors that are time dependent on data packets;

synchronizing the slow factors with specific data inputs based on dependencies on the data packets using synchronization hardware coupled to the second hardware register;

computing a link budget to determine probability of loss of data packets using a hardware adder coupled to the first hardware register and the second hardware register, wherein computing the link budget comprises computing a ratio $E_b/N_0$, which is the ratio of energy per bit to noise spectrum density, or $E_s/N_0$, which is the ratio of energy per symbol to noise spectrum density; and using a hardware processor coupled to the hardware adder, determining, based on the link budget, if a data packet should be dropped, and when the data packet should be dropped, dropping the data packet for simulating a network physical layer.

10. A method of simulating lost data packets in a network simulation, the method comprising:

configuring a first hardware register to store data for fast factors, the fast factors comprising factors that are time independent with respect to particular data packets;

configuring a second hardware register configured to store slow factors, the slow factors comprising factors that are time dependent on data packets;

coupling synchronization hardware to the second hardware register configured to synchronize the slow factors with specific data inputs based on dependencies on the data packets;

coupling a hardware adder to the first hardware register and the second hardware register to compute a link budget, wherein the link budget is used to determine probability of loss of data packets;

coupling a hardware processor to the hardware adder;

configuring the hardware processor to determine, based on the link budget, if a data packet should be dropped, and when the data packet should be dropped, to drop the data packet for simulating a network physical layer; and configuring the synchronization hardware to use a specialized control frame comprising a header inserted into a packet of a waveform which includes information identifying the slow factors, where the slow factors are to be applied to the packet into which the header is inserted.

11. The method of claim 10, wherein configuring the first hardware register to store data for fast factors comprises configuring the first hardware register to store one or more of antenna gains, propagation loss, platform dynamics, interference, geometry changes, changes in terrain, wing obstructions on an aircraft, weather conditions, temperature changes, differences pf polarization between antennas, or distance between transmitters and receivers.

12. The method of claim 10, wherein configuring the second hardware register to store slow factors comprises configuring the second hardware register to store one or more discrete events.

13. The method of claim 10, wherein configuring the second hardware register to store slow factors comprises configuring the second hardware register to store changes in signal power.

14. The method of claim 10, wherein configuring the second hardware register to store slow factors comprises configuring the second hardware register to store changes in data rate.

15. The method of claim 10, wherein computing the link budget comprises computing a ratio $E_b/N_0$, which is the ratio of energy per bit to noise spectrum density, or $E_s/N_0$, which is the ratio of energy per symbol to noise spectrum density.

16. The method of claim 10, wherein a table comprising link budget entries is used to determine the probability of loss.

17. The method of claim 10, further comprising configuring the synchronization hardware to have a state machine with three states, where the first state applies the slow factors, the second state causes data to be sent with the slow factors applied, and the third state waits for applicable data that is to be correlated with the slow factors to be sent.

18. The method of claim 9, further comprising using a state machine in the synchronization hardware to switch between three states, where the first state applies the slow factors, the second state causes data to be sent with the slow factors applied, and the third state waits for applicable data that is to be correlated with the slow factors to be sent.

19. The method of claim 9, wherein storing data for fast factors in a first hardware register comprises storing one or more of antenna gains, propagation loss, platform dynamics, interference, geometry changes, changes in terrain, wing obstructions on an aircraft, weather conditions, temperature changes, differences pf polarization between antennas, or distance between transmitters and receivers.

20. The method of claim 9, wherein storing slow factors in a second hardware register comprises at least one of storing one or more discrete events, storing changes in signal power, or storing changes in data rate.

* * * * *